(12) United States Patent
Kinoshita

(10) Patent No.: US 8,044,378 B2
(45) Date of Patent: Oct. 25, 2011

(54) METHOD OF MANUFACTURING PHOTO INTERRUPTER INCLUDING A POSITIONING MEMBER WITH AT LEAST ONE POSITIONING PIN INTEGRALLY PROVIDED WITH A CONNECTING PART, AND PHOTO INTERRUPTER MANUFACTURED THEREBY

(75) Inventor: Jo Kinoshita, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 289 days.

(21) Appl. No.: 12/401,010

(22) Filed: Mar. 10, 2009

(65) Prior Publication Data
US 2010/0032592 A1   Feb. 11, 2010

(30) Foreign Application Priority Data

Aug. 6, 2008 (JP) ................................. 2008-202596

(51) Int. Cl.
*G02B 27/00* (2006.01)
(52) U.S. Cl. ........................................ 250/551; 250/239
(58) Field of Classification Search .................. 250/551, 250/239, 227.11; 385/24, 49, 46, 99, 96
See application file for complete search history.

(56) References Cited

U.S. PATENT DOCUMENTS
5,567,953 A * 10/1996 Horinouchi et al. .......... 250/551
7,459,711 B2 * 12/2008 Suzuki ........................ 250/551

FOREIGN PATENT DOCUMENTS
JP           3640456 B2      8/1997
JP         2000012892 A      1/2000

* cited by examiner

*Primary Examiner* — Que T Le
(74) *Attorney, Agent, or Firm* — Browdy and Neimark, PLLC

(57) ABSTRACT

A method of manufacturing a photo interrupter includes forming a frame including a first frame part and a second frame part which are disposed at an interval to be facing each other, mounting at least one light-emitting element on a first board and attaching the first board to the first frame part of the frame, mounting a light-receiving element on a second board and attaching the second board to the second frame part of the frame, the light-receiving element being mounted on the second board to be facing the light-emitting element so that the light-receiving element receives light emitted from the light-emitting element, and providing a positioning member on the frame by integrally forming the positioning member with the frame.

11 Claims, 12 Drawing Sheets

METHOD OF MANUFACTURING PHOTO INTERRUPTER INCLUDING A POSITIONING MEMBER WITH AT LEAST ONE POSITIONING PIN INTEGRALLY PROVIDED WITH A CONNECTING PART, AND PHOTO INTERRUPTER MANUFACTURED THEREBY

CROSS-REFERENCE TO RELATED APPLICATION

This application is based on and claims the priority benefit of Japanese Patent Application No. 2008-202596, filed on Aug. 6, 2008, the disclosure of which is incorporated herein by reference in its entirety.

BACKGROUND OF THE INVENTION

1. Field of the Invention

The present invention relates to a method of manufacturing a photo interrupter to detect presence and absence or passing of an object with non-contact and a photo interrupter manufactured by the method of manufacturing.

2. Description of the Related Art

It is known that a photo interrupter is used in the field of information equipment, for example, in in-vehicle air conditioner panel operating switches, navigation control units, DVD recorders, digital cameras, printers, PC peripheral instruments or the like and can reliably detect a position or presence and absence or the like of an object with non contact by receiving light from a light-emitting element by a light-receiving element.

In recent years, a microminiature photo interrupter is widely used accompanying the further miniaturization of and thinning of information equipment; in addition, such a compact photo interrupter is often surface-mounted on a motherboard of the information equipment or the like. In a surface-mount type photo interrupter, accuracy of detecting a position of an object is directly influenced by variation in a position of mounting the photo interrupter on the motherboard. Accordingly, it is necessary to position the photo interrupter on the motherboard accurately.

A conventional photo interrupter includes a board on which a light-emitting element is mounted, a board on which a light-receiving element is mounted, a generally U-character-shaped frame having element frames on which the boards are mounted and configured to form a light path from the light-emitting element to the light-receiving element, and a positioning member formed to project from a lower surface of the frame, the positioning member being inserted into a hole provided in a motherboard or the like to position the interrupter on the motherboard (for reference, see Japanese Patent Application Publication No. 2000-12892, page 3 of the specification, FIG. 1).

On the other hand, there is known a method of manufacturing a plurality of photo interrupters at the same time by use of a collecting board on which a plurality of light-emitting elements are mounted, a collecting board on which a plurality of light-receiving elements are mounted, and a frame assembly in which a plurality of U-character-shaped frames are connected, forming a photo interrupter assembly by adhering the collecting board on which the plurality of light-emitting elements are mounted and the collecting board on which the plurality of light-receiving elements are mounted, to upper and lower surfaces of the frame assembly, respectively, and dividing the formed photo interrupter assembly by dicing into an individual photo interrupter (for reference, see Japanese Patent No. 3640456, pages 3 to 4 of the specification, FIG. 2).

However, in the conventional photo interrupter as disclosed in Japanese Patent Application Publication No. 2000-12892, despite the accomplishment of a high accuracy in positioning of the photo interrupter on the motherboard by the positioning member provided on the frame, because the positioning member is formed separately from the frame, an extra process is required to make a plurality of positioning members and a troublesome operation is required to mount very small positioning members on the frame one by one. Consequently, increased manufacturing cost due to increased manufacturing processes or the like is unavoidable.

Furthermore, in the conventional manufacturing method for the photo interrupter as disclosed in Japanese Patent No. 3640456, because a mounting surface of the photo interrupter, to be placed on a motherboard, is a surface cut by dicing, it is not possible to provide a positioning pin or the like on the cut surface. Therefore, there is a problem that variation in a position of attaching the photo interrupter to the motherboard occurs, resulting in a photo interrupter of low accuracy.

SUMMARY OF THE INVENTION

An object of the present invention is to provide a method of manufacturing a photo interrupter, capable of providing accurately and in a simple operation a positioning member to mount the photo interrupter on a motherboard or a substrate and manufacturing the photo interrupter in large numbers and inexpensively.

To accomplish the above object, a method of manufacturing a photo interrupter according to one embodiment of the present invention includes forming a frame including a first frame part and a second frame part that are disposed at an interval to be facing each other a connecting part integrally connecting the first frame part and the second frame part, and a positioning member integrally provided with the connecting part; mounting at least one light-emitting element on a first board and attaching the first board to the first frame part of the frame, mounting a light-receiving element on a second board and attaching the second board to the second frame part of the frame, the light-receiving element being mounted on the second board to be facing the light-emitting element.

A method of manufacturing a photo interrupter, according to another embodiment of the present invention includes a first collecting board forming process including a step of mounting a plurality of light-emitting elements on a first surface of a first board material that includes a plurality of slits, a circuit pattern provided on the first surface of the first board material, and an electrode pattern provided on a second surface of the first board material and electrically connected to the circuit pattern; a second collecting board forming process including a step of mounting a plurality of light-receiving elements on a first surface of a second board material that includes a plurality of slits, a circuit pattern provided on the first surface of the second board material, and an electrode pattern provided on a second surface of the second board material and electrically connected to the circuit pattern; a combined frame forming process of forming a combined frame in which at least two frames are combined, each frame having a U-character-like shape and including a first frame part, a second frame part disposed to face the first frame part, a connecting part connecting the first and second frame part, and at least one positioning member provided on a lower surface of the connecting part;

a frame assembly forming process include a plurality of combined frames are integrated in a state where the first frame part and the second frame part of each of the combined frames are abutted; a first integrating process of integrating the first collecting board and the frame assembly by positioning the first frame parts of the plurality of combined frames on the plurality of light-emitting elements mounted on the first collecting board, respectively, aligning the connecting parts having the positioning pins of the combined frames with the slits of the first collecting board, and adhering fixedly the first surface of the first collecting board and the plurality of combined frames; a second integrating process of integrating the second collecting board and the frame assembly to form a photo interrupter assembly by positioning the plurality of light-receiving elements of the second collecting board on the second frame parts of the plurality of combined frames adhered and fixed on the first collecting board, aligning the lower surfaces of the connecting parts having the positioning members of the combined frames with the slits of the second collecting board, and adhering fixedly the first surface of the second collecting board and the plurality of combined frames; and a separating process of separating the completed photo interrupter assembly by cutting the photo interrupter assembly by dicing and dividing it into a plurality of individual photo interrupters.

Here, the frame assembly in the frame assembly forming process is a column frame in which the plurality of combined frames are arranged in a column to abut side surfaces of the first frame parts of adjacent combined frames with each other, and side surfaces of the second frame parts of adjacent combined frames with each other.

Moreover, the frame assembly in the frame assembly forming process is a matrix frame in which a plurality of column frames are arranged row-wise and connected to abut the positioning pins with each other.

Also, a photo interrupter comprising:
a frame including a first frame part and a second frame part that are disposed at an interval to face each other, a connecting part integrally connecting the first frame part and the second frame part, and a positioning member integrally provided with the connecting part;
a first board provided at the first frame part;
at least one light-emitting element mounted on the first board;
a second board provided at the second frame part;
at least one light-receiving element mounted on the second board to face the at least one light-emitting element.

BRIEF DESCRIPTION OF TEE DRAWINGS

DETAILED DESCRIPTION OF THE PREFERRED EMBODIMENTS

Embodiments of the present invention will be described in detail hereinafter with reference to the accompanying drawings.

First Embodiment

Figure 1:
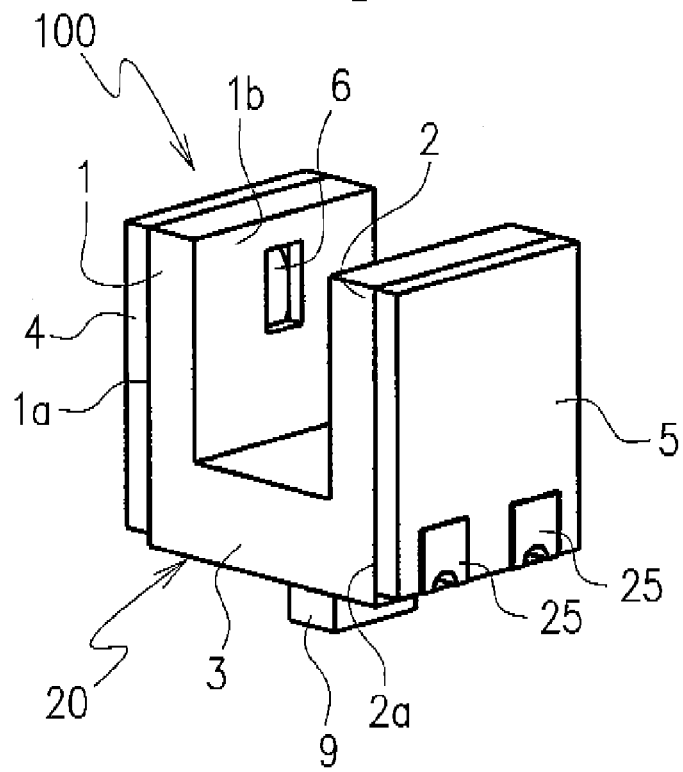
FIG. 1 is a perspective view showing an exterior appearance of a photo interrupter manufactured by a manufacturing method for a photo interrupter, according to a first embodiment of the present invention.
Figure 3:
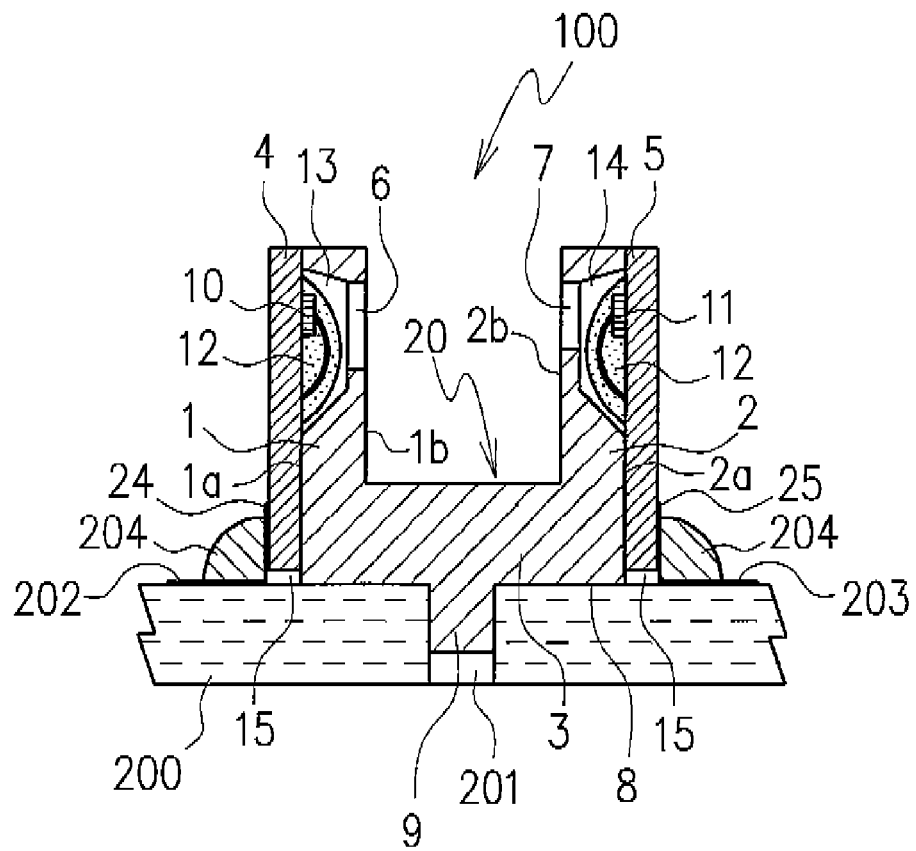
FIG. 3 is a sectional view showing an example in which the photo interrupter manufactured by the manufacturing method according to the present invention is mounted on a motherboard.

FIG. 1 to FIGS. 1 to 3 illustrates a first embodiment of a photo interrupter. A photo interrupter 100 having a frame that includes a first frame part 1 and a second frame part 2 that are disposed at an interval to face each other, a connecting part 3 integrally connecting the first frame part 1 and the second frame part 2, and a positioning member 6 integrally provided at a lower surface of the connecting part. The photo interrupter further includes a first board 4 provided at the first frame part, at least one light-emitting element mounted on the first board and its light-emitting surface exposed from an opening of the first frame part, a second board provided at the second frame part, and at least one light-receiving element mounted on the second board and its receiving surface exposed from an opening of the second frame part to face the at least one light-emitting element.

Figure 4:
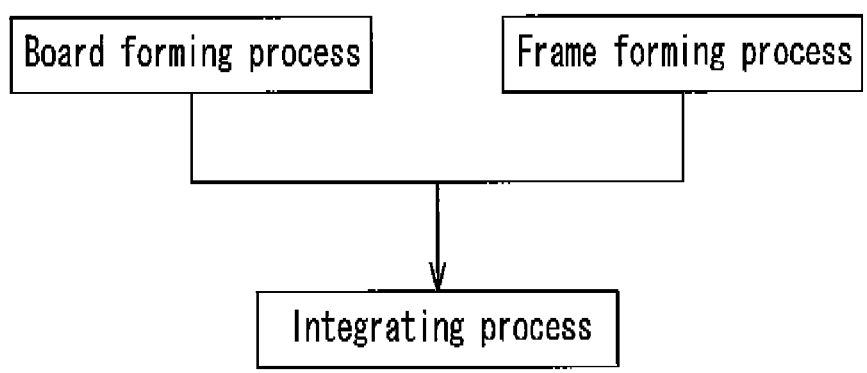
FIG. 4 is a view showing a manufacturing process of the photo interrupter according to the first embodiment of the present invention.

FIG. 4 illustrate a first embodiment of a method of manufacturing a photo interrupter and a photo interrupter manufactured by the manufacturing methods according to the present invention. The photo interrupter 100 in this first embodiment is basically manufactured through a frame forming process, a board forming process and an integrating process of integrating a frame and a board, as mentioned hereinafter. Meanwhile, it should be noted that an order of the frame forming process and the board forming process is not limited to the following, and may be set arbitrarily.

The frame forming process is first described as follows.

A frame 20 having a generally U-character-like shape is made of, for example, a thermally-resistant engineering plastic material or the like and is formed by integrally molding all of a first frame part 1 and a second frame part 2 that are disposed at a predetermined interval to face each other and each have a rectangular shape of a predetermined thickness, a connecting part 3 integrally connecting the first frame part 1 and the second frame part 2 and a positioning member, for example, a positioning pin 9 integrally provided on a lower surface 8 of the connecting part 3.

It is preferable that injection molding be used as a method of forming the frame 20.

A first containing part 13 is provided in an outer surface 1a of the first frame part 1, and a first opening 6 communicating with the first containing part 13 is provided in an inner surface 1b of the first frame part 1. A second containing part 14 is provided in an outer surface 2a of the second frame part 2, and a second opening 7 communicating with the second containing part 14 is provided in an inner surface 2b of the second frame part 2. The first opening 6 and the second opening 7 are disposed to be facing each other (see FIG. 3).

The positioning pin 9 is provided for positioning when mounting the photo interrupter 100 in an appropriate position on any member, for example, a motherboard 200 of such as an information instrument or the like, as shown in FIG. 3. In other words, the positioning pin 9 is fitted in an engaging hole 201 provided in the motherboard 200 and is configured to achieve electrical connection by positioning the photo interrupter 100 at a predetermined position of the motherboard 200. The positioning pin 9 may have any cross-sectional shape such as a round shape, an oval shape, a rectangular shape or the like.

In addition, the positioning pin 9 has a structure in which the positioning pin is inserted in the engaging hole 201 in a state where a force is applied, and is not easily removed from the engaging hole 201. In other words, the positioning pin 9 is press-fitted in the engaging hole 201 to be firmly fixed.

Next, the board forming process is described.

In the board forming process, first, at least one light-emitting element 10 is mounted on a first board 4, and at least one light-receiving element is mounted on a second board 5. Here, the light-emitting element 10 is mounted on a first surface of the first board 4 facing the first frame part 1 and the light-receiving element 11 is mounted on a first surface of the second board 5 facing the second frame part 2 (see FIG. 3). In addition, an electrode 24 which is electrically connected to a circuit pattern (not shown) on which the light-emitting element 10 is mounted, via through-holes (not shown), is provided on a second surface opposite to the first surface of the first board 4, and similarly, an electrode 25 which is electrically connected to a circuit pattern (not shown) on which the light-receiving element 11 is mounted, via through-holes (not shown), is provided on a second surface opposite to the first surface of the second board 5.

Meanwhile, the first board 4 and the second board 5 are respectively made of, for example, a glass epoxy resin. On the other hand, the light-emitting element 10 comprises, for example, an infrared light-emitting diode, and the light-receiving element 11 comprises, for example, a photo transistor.

Next, each of the light-emitting element 10 and the light-receiving element 11 which are mounted on the first board 4 and the second board 5, respectively, is sealed by a light-transmitting resin 12 (see FIG. 3). The light-transmitting resin 12 comprises, for example, an epoxy-system resin.

Next, the integrating process of integrating the frame and the board which are formed as mentioned above is described.

In the integrating process, the rectangular first board 4 is attached to an outer surface 1a of the first frame part 1 and the rectangular second board 5 is attached to an outer surface 2a of the second frame part 2, respectively. It is preferable that an appropriate adhesive be used as a method of attaching.

When the first board 4 is attached to the first frame part 1, the light-emitting element 10 and the light-transmitting resin 12 are contained in the first containing part 13. When the second board 5 is attached to the second frame part 2, the light-receiving element 11 and the light-transmitting resin 12 are contained in the second containing part 14. In addition, the light-emitting element 10 and the light-receiving element 11 are positioned to be facing each other so that light emitted from the light-emitting element 10 is received into the light-receiving element 11. Consequently, light emitted from the light-emitting element 10 and passing through the first opening 6 and the second opening 7 can be received by the light-receiving element 11. In other words, the first opening 6 of the first frame part 1 and the second opening 7 of the second frame part 2 are configured to form a light path from the light-emitting element 10 to the light-receiving element 11.

When the photo interrupter 100 formed through each process as mentioned above is mounted on the motherboard 200 of such as an information instrument or the like, a lower surface 8 of the connecting part 3 of the frame is disposed to be closely fitted to a surface of the motherboard 200, and by passing an assembly thereof through a reflow furnace, the electrode 24 provided on the first board 4 and the electrode 25 provided on the second board 5 are electrically connected to electrodes 202 and 203 of an electronic circuit (not shown) provided on the motherboard 200 by soldering, respectively. In addition, the photo interrupter 100 also is fixed to the motherboard 200 by way of the soldering.

By the aforementioned electrical connection, the photo interrupter 100 is configured to detect presence and absence of an object to be detected between the first opening 6 and the second opening 7 which are disposed to be facing each other and convert a detected value into an electric signal to be supplied to an electronic circuit (not shown) of the motherboard 200.

As shown in FIG. 3, a gap 15 is provided between an end surface of each of the first board 4 and the second board 5 in sides provided with the electrodes 24 and 25 and a surface of the motherboard 200. Consequently, only the lower surface 8 of the connecting part 3 is closely fitted to the surface of the motherboard 200, and thereby the photo interrupter 100 can be placed vertically, resulting in prevention of an inclination of the photo interrupter 100.

In this case, the photo interrupter 100 is placed on the motherboard 200 by fitting the positioning pin 9 integrally formed with the frame 20 in the engaging hole 201 of the motherboard 200, and the photo interrupter 100 can be accurately disposed at a predetermined position of the motherboard 200 merely by passing it through the reflow furnace.

In addition, the photo interrupter 100 is positioned on the surface of the motherboard 200 approximately in a vertical state. Consequently, it is possible to accomplish accurate positional detection of an object to be detected, without variations in detection of a mechanical operational position of the object.

Second Embodiment

Next, a method of manufacturing a photo interrupter, according to a second embodiment of the present invention and a photo interrupter manufactured by the same are described.

The manufacturing method in the second embodiment is configured to be capable of manufacturing a plurality of photo interrupters each having the aforementioned structure at a time. The manufacturing method basically includes a collecting board forming process, a frame assembly forming process, an integrating process and a separating process, which are described hereinafter. Here, it should be noted that an order of performing the collecting board forming process and the frame assembly forming process are not limited to the following order and may be set arbitrarily. In addition, the collecting board forming process includes a first collecting board forming process and a second collecting board forming process, in which an order thereof is not limited to the following order. Moreover, the integrating process includes a first integrating process and a second integrating process, as mentioned below.

Figure 5:
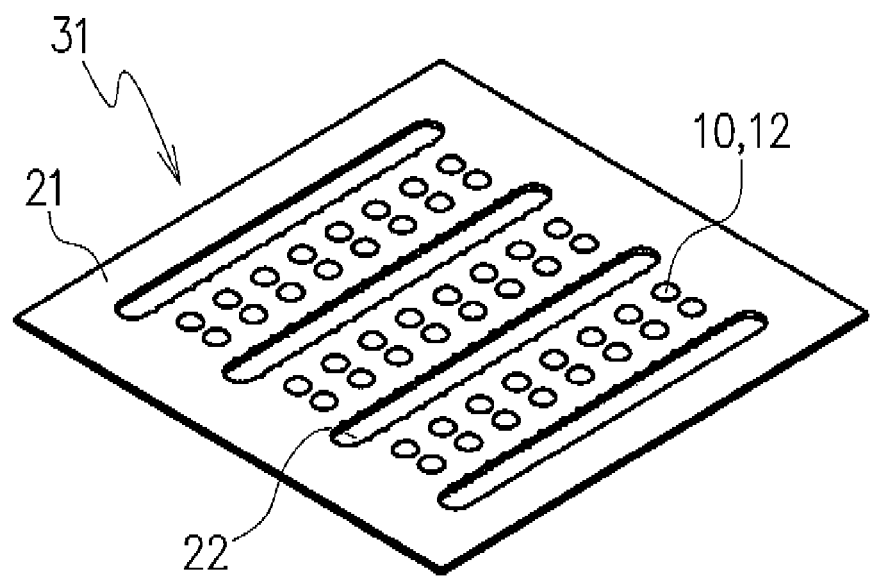
FIG. 5 is a perspective view showing a front surface side of a first collecting board in a manufacturing method for a photo interrupter, according to a second embodiment of the present invention.

The first collecting board forming process is configured to form a first collecting board 31 which is a collective of first boards each corresponding to the aforementioned first board 4 and described with reference to FIGS. 5 and 6.

A first board material 21 comprising a generally rectangular shaped plate is first prepared. The first board material 21 is formed to include a plurality of spaced elongated hole-like slits 22 which are disposed in parallel to each other and a circuit pattern (not shown) which is provided on one surface, for example, an upper surface of the board material 21 and between adjacent slits. A plurality of light-emitting elements 10 are mounted on the circuit pattern. In the illustrated embodiment, the light-emitting elements 10 are arranged in one side of each of the slits at both sides and in both sides of each of the intermediate slits (see FIG. 5). A reason for providing the slits 22 is described hereinafter. The plurality of light-emitting elements 10 are die-bonded and wire-bonded to the circuit board to be electrically connected thereto.

Next, each of the plurality of light-emitting elements 10 and the bonding wire corresponding to each light-emitting element are sealed by a light-transmitting resin 12.

Figure 6:
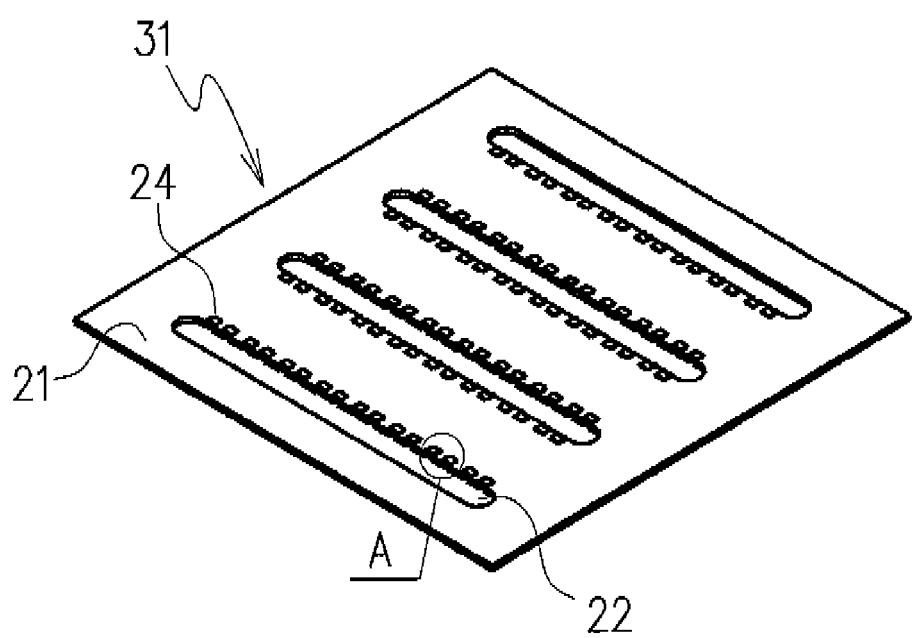
FIG. 6 is a perspective view showing a back surface side of the first collecting board in FIG. 5.

FIG. 6 illustrates another surface, for example, a lower surface of the board material 21 of the first collecting board 31. The first collecting board 31 is formed to have a plurality of electrodes 24 provided on the lower surface of the board material 21. The electrodes 24 are configured to be disposed to correspond to the light-emitting elements 10, and two sets of the electrodes 24 per one light-emitting element are patterned to be arranged at equal intervals along the slots 22.

Figure 2:
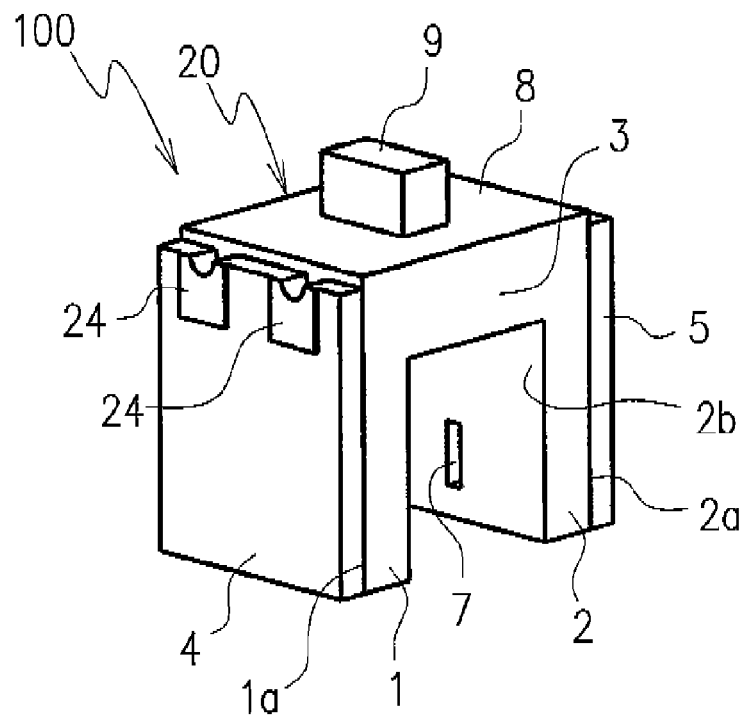
FIG. 2 is a perspective view showing an exterior appearance of the photo interrupter as shown in FIG. 1 in an inverted state.
Figure 7:
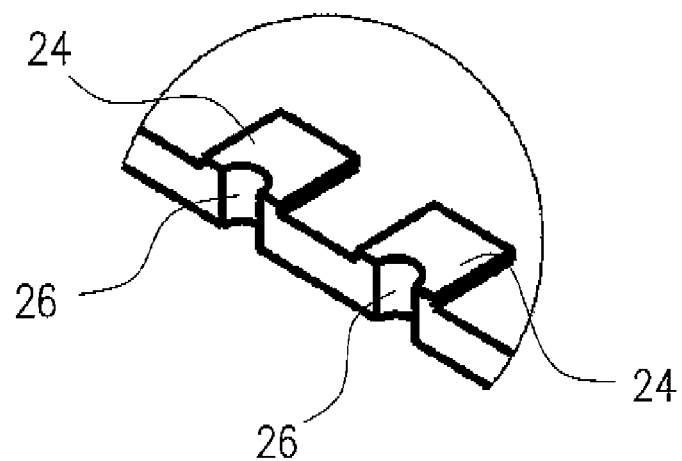
FIG. 7 is an enlarged perspective view of portion A in FIG. 6.

As shown in FIG. 7 which is an enlarged perspective view of portion A in FIG. 6, each of the electrodes 24 is electrically connected via semi-circular through-holes 26 provided in an end edge of each of the slits to the circuit pattern (not shown) on which the light-emitting elements 10 are mounted to be electrically connected to exterior electrodes. The two sets of the electrodes 24 correspond to the electrodes 24 shown in FIGS. 1 to 3 in the first embodiment.

Next, the second collecting board forming process configured to form a second collecting board 32 which is a collective of second boards each corresponding to the aforementioned second board 5 is described with reference to FIG. 12.

The second collecting board forming process has a similar structure to the first collecting board forming process merely by substituting slits 23 similar to the slits 22 formed in the aforementioned first collecting board 31 for the slits 22, light-receiving elements 11 for the light-emitting elements 10 and electrodes 25 for the electrodes 24, respectively. Meanwhile, a second board material similar to the first board material is used in the second collecting board forming process.

Further description of the second collecting board forming process is omitted to avoid repetition.

Next, the frame assembly forming process configured to form an assembly of a plurality of combined frames, each of which is a collective of frames each corresponding to the aforementioned frame 20 is described with reference to FIGS. 8 and 9.

Figure 8:
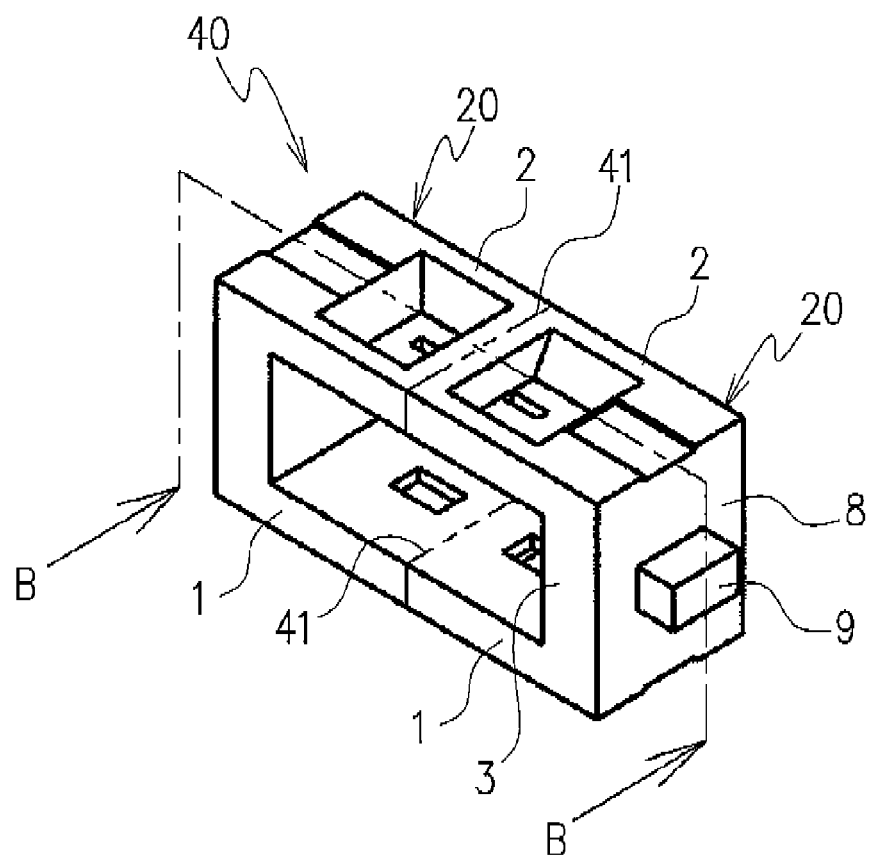
FIG. 8 is a perspective view showing an exterior appearance of a combined frame in the manufacturing method according to the second embodiment of the present invention.

FIG. 8 illustrates one of combined frames 40.

The combined frame 40 as shown in FIG. 8 has a structure in which two generally U-character-shaped frames 20 are abutted with each other at a virtual dicing separation line 41. The frame assembly forming process includes forming a plurality of combined frames 40, in each of which, each of the two frames 20 includes a first frame part 1 and a second frame part 2. In the two frames 20, the first frame parts 1 are abutted with each other at end surfaces and the second frame parts 2 are abutted with each other at end surfaces. Here, each of the frames 20 includes a first opening 6 and a first containing part 13 which are provided in the first frame part 1, a second opening 7 and a second containing part 14 which are provided in the second frame part 2, a connecting part 3 to connect the first frame part 1 and the second frame part 2, and at least one positioning pin 9 provided on a lower surface 8 of the connecting part 3, in addition to the first frame part 1 and the second frame part 2 (see FIG. 9). The first opening 6, the first containing part 13, the second opening 7, the second containing part 14, the connecting part 3 and the positioning pin 9 are integrally formed when forming the frame 20 by injection molding.

Figure 9:
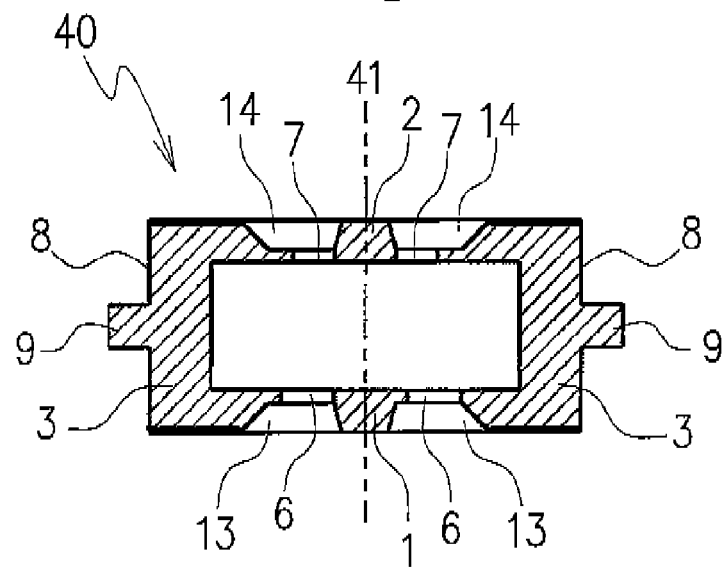
FIG. 9 is a sectional view taken along line B-B of the combined frame as shown in FIG. 8.

When all the combined frames 40 are formed, each combined frame 40 is right-left symmetric with respect to a central line which is the dicing separation line 41, as shown in FIG. 9 which is a sectional view taken along line B-B in FIG. 8. More specifically, the first frame part 1 and the second frame part 2 which are provided on each frame 20, the first opening 6 and the first containing part 13 which are provided in the first frame part 1, the second opening 7 and the second containing part 14 which are provided in the second frame part 2, the connecting part 3 to connect the first frame part 1 and the second frame part 2, and the at least one positioning pin 9 provided on the lower surface 8 of the connecting part 3 are all disposed with right-left symmetry. The formed combined frames 40 are arranged to form a photo interrupter assembly together with the first and second collecting boards, as described hereinafter.

Next, the first integrating process configured to integrate the first collecting board and the combined frames is described with reference to FIGS. 10 and 11.

Figure 10:
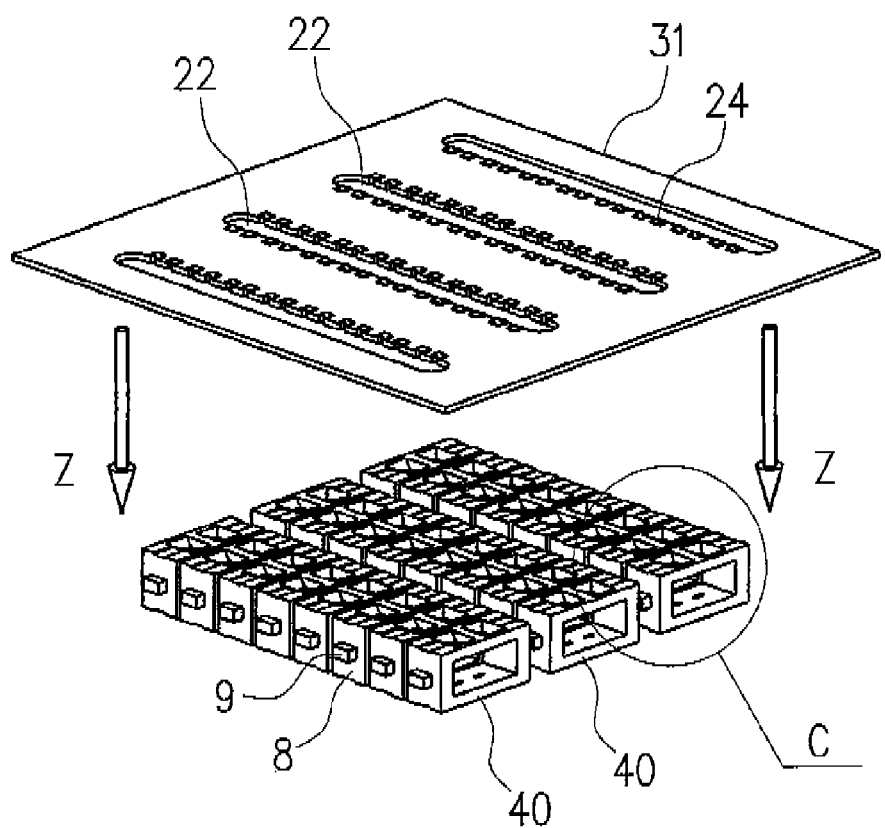
FIG. 10 is a perspective view showing schematically a positioning and an adhesive process of a plurality of arranged combined frames and the first collecting board.
Figure 11:
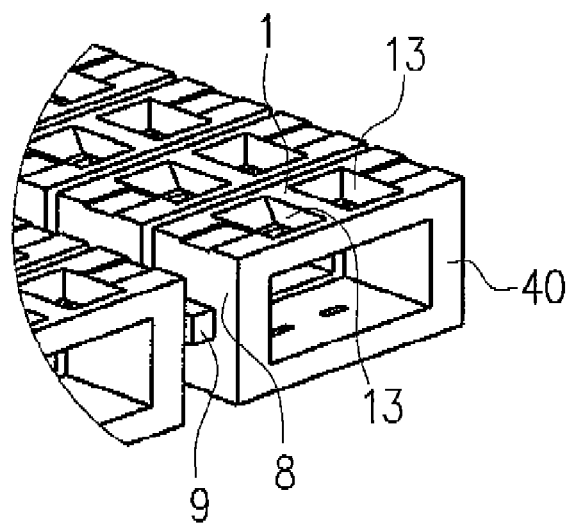
FIG. 11 is an enlarged perspective view of portion C in FIG. 10.

In FIGS. 10 and 11, the first collecting board 31 is set in a state where the lower surface on which the plurality of electrodes are mounted is disposed upwardly, and the plurality of combined frames 40 are arranged on a tray (not shown) so that the first frame part 1 is disposed upwardly and the first containing part 13 is disposed to open upwardly, and therefore a frame assembly in which a plurality of combined frames are arranged in an appropriate arrangement is formed. The plurality of combined frames 40 and the first collecting board 31 are positioned so that the light-transmitting resin 12 (see FIG. 5) sealing each of the plurality of light-emitting elements 10 is aligned with the first containing part 13 of each of the combined frames 40 in position, and the positioning pin 9 provided on the lower surface 8 of the connecting part 3 is inserted in each of the slits 22. To execute such a positioning, it is possible to use a method in which the tray and the first collecting board 31 are positioned by at least one appropriate guide pin, a method in which the combined frames 40 and the first collecting board 31 are positioned using an image-recognition device, or the like.

Next, an adhesive is applied to a surface of the first frame part 1 of each of the combined frames 40, and the first collecting board 31 is then adhered fixedly to the plurality of combined frames 40 by moving it in a direction of arrow Z (see FIG. 10). The process of integrating the first collecting board with the arranged combined frames 40 is thereby completed.

Next, the second integrating process configured to integrate the second collecting board and the combined frames is described with reference to FIGS. 12 and 13.

Figure 12:
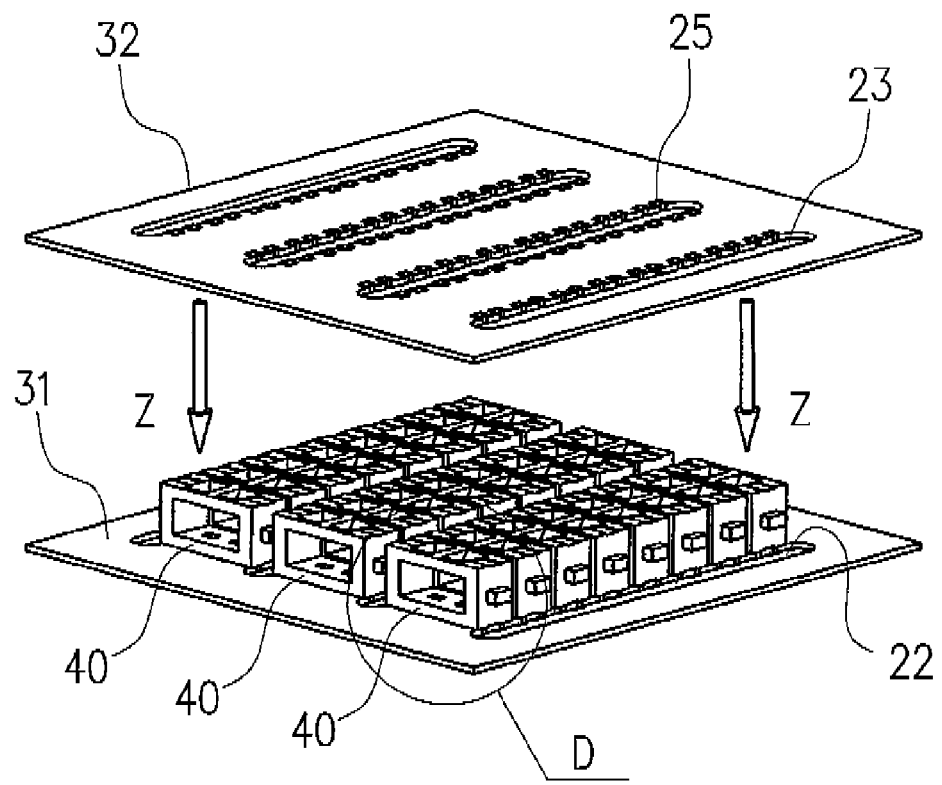
FIG. 12 is a perspective view showing schematically a positioning and an adhesive process of the plurality of combined frames integrally adhered to the first collecting board and a second collecting board.
Figure 13:
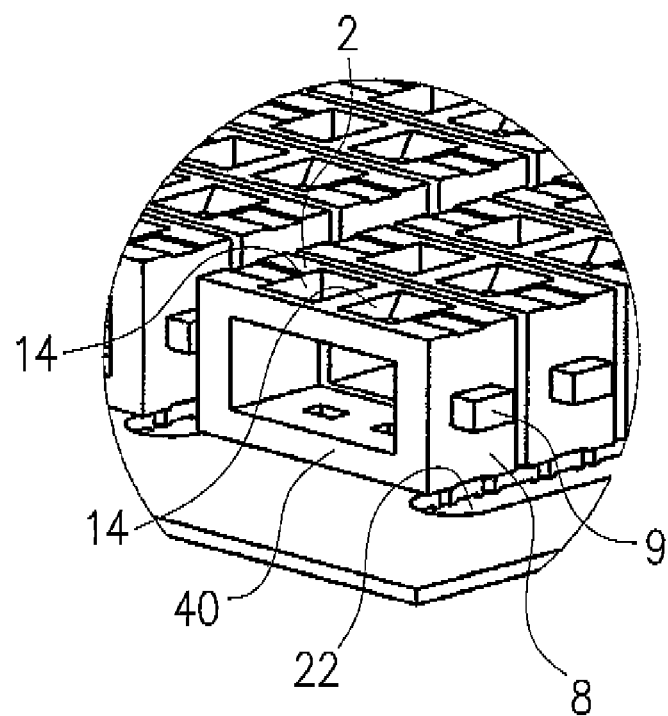
FIG. 13 is an enlarged perspective view of portion D in FIG. 12.

In FIGS. 12 and 13, the plurality of combined frames 40 adhered to the first collecting board 31 are set on a tray (not shown) in a state where the second frame part 2 is disposed upwardly. The second collecting board 32 is positioned so that the lower surface on which the plurality of electrodes 25 are mounted is disposed upwardly, and similarly to the first integrating process configured to integrate the first collecting boards and the combined frames, the light-transmitting resin 12 sealing each of the plurality of light-receiving elements 11 are aligned with the second containing part 14 of each of the combined frames 40 in position, and the positioning pin 9 provided on the lower surface 8 of the connecting part 3 is inserted in each of the slits 22.

Next, an adhesive is applied to a surface of the second frame part 2 of each of the combined frames 40, and the first collecting board 31 is then adhered fixedly to the plurality of combined frames 40 by moving it in a direction of arrow Z (see FIG. 12).

A assembly of photo interrupters in which the plurality of combined frames, the first collecting board and the second collecting board are integrated is thereby completed.

Next, the completed photo interrupter assembly 90 is described in detail with reference to FIGS. 14 to 17.

Figure 14:
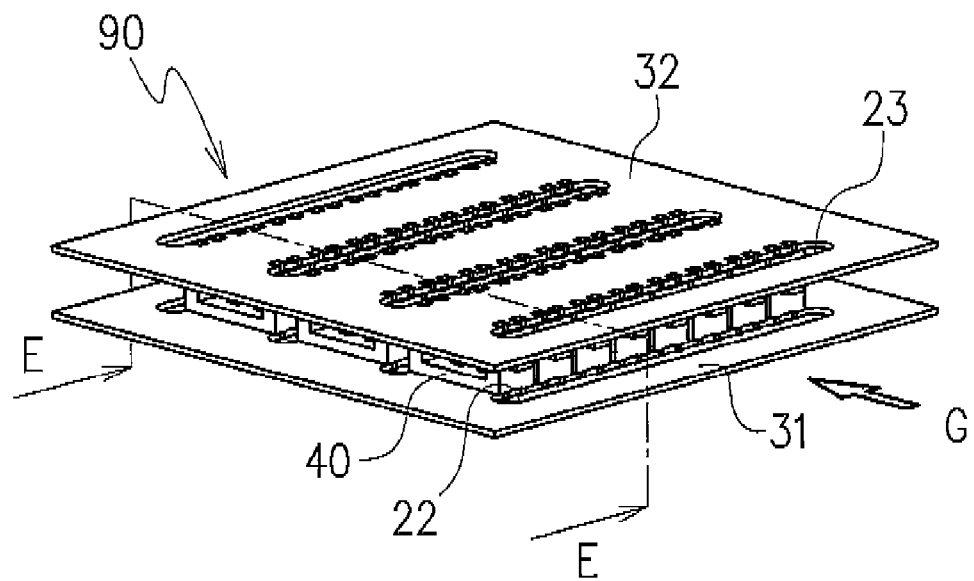
FIG. 14 is a perspective view showing an exterior appearance of a photo interrupter assembly as manufactured by the manufacturing method according to the second embodiment of the present invention.

As shown in FIG. 14, the photo interrupter assembly 90 is formed by disposing the plurality of combined frames 40 between the first collecting board 31 and the second collecting board 32 and integrating them with each other by an adhesive. At this time, the slits 22 of the first collecting board 31 and the silts 23 of the second collecting board 32 are disposed to be facing each other in a state where the first collecting board 31 and the second collecting board 32 hold the plurality of combined frames 40 from above and below. Consequently, the slits 22 and 23 have a function of a boundary to separate two adjacent combined frames.

Figure 15:
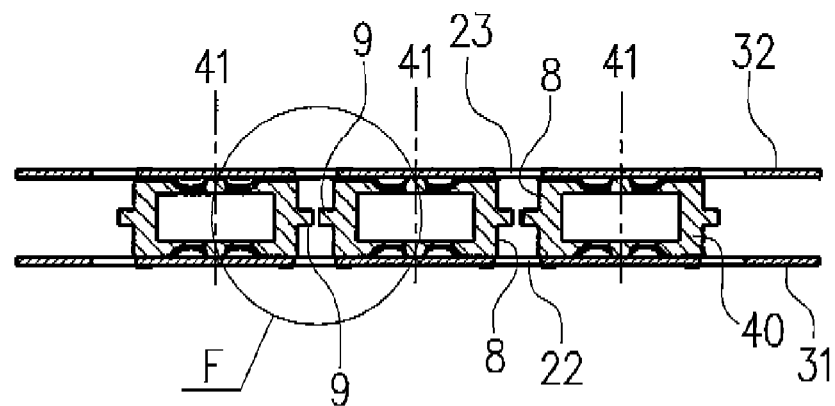
FIG. 15 is a sectional view taken along line E-E of the photo interrupter assembly as shown in FIG. 14.

In FIG. 15 which is a sectional view taken along line E-E in FIG. 14, dicing lines 41 to separate each combined frame 40 at a generally central position thereof and extending in a direction perpendicular to the section are shown. Here, long sides of each of the adjacent slits 22 and the adjacent slits 23 are configured to previously form end surfaces of electrode sides of the first board 4 and the second board 5 (see FIGS. 1 to 3) at the lower surface 8 of the connecting part 3 of each of the frames 20. Also, cut portions of each combined frame 40 at the dicing line 41 where the combined frame 40 is divided into two are configured to form end surfaces of the first board and the second board and leading end portions of the U-character-shaped frame 20. Accordingly, no cutting by dicing is required to the slits 22 and 23, and each of the lower surface 8 of the connecting part 3 and the positioning pin 9 can retain a shape when formed without being cut.

Figure 16:
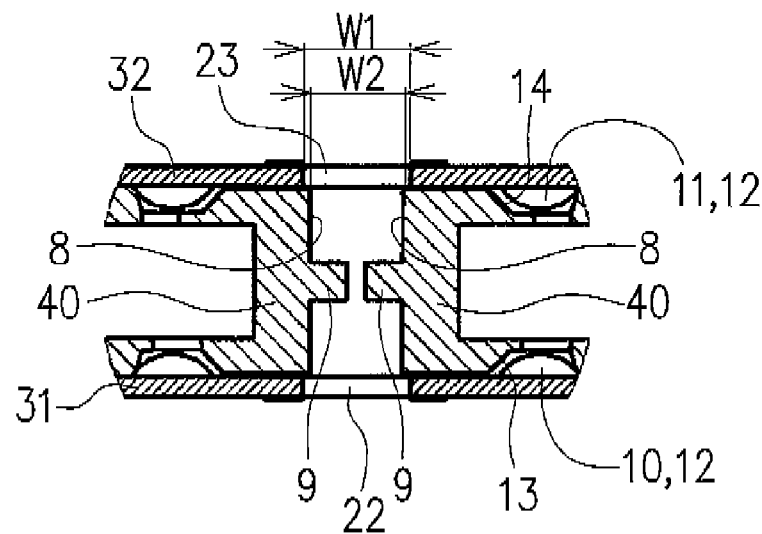
FIG. 16 is an enlarged sectional view of portion F in FIG. 15.

FIG. 16 illustrates an enlarged state of portion F in FIG. 15 and a relationship between the first collecting board 31, the second collecting board 32 and the combined frames 40 in detail.

The light-transmitting resin 12 sealing each of the light-emitting element 10 and the light-receiving element 11 of each of the frames of the combined frame 40 is mounted on each of the first collecting board 31 and the second collecting board 32 and contained in each of the first containing part 13 and the second containing part 14 of each frame.

The lower surface 8 of the connecting part of each frame, on which the positioning pin 9 is provided, is positioned in alignment with to each of the slits 22 and 23 of the first collecting board 31 and the second collecting board 32. A positional relationship between each of the slits 22 and 23 of the first collecting board 31 and the second collecting board 32 and the combined frame 40 is set so that an interval W2 between the lower surfaces 8 of the connecting parts of adjacent frames is equal to or less than a width W1 of each of the slits 22 and 23 (see FIG. 16). Because the slits 22 and 23 form the end surfaces of the side of the electrodes of the first board and the second board (see FIGS. 1 to 3) of the lower surface 8 side of the connecting part, a gap 15 is provided between an end surface of each of the first board 4 and the second board 5 and an upper surface of a motherboard 200 when the lower surface 8 of the photo interrupter 100 is in contact with the upper surface of the motherboard 200 when mounting the photo interrupter on the motherboard, as shown in FIG. 3.

Figure 17:
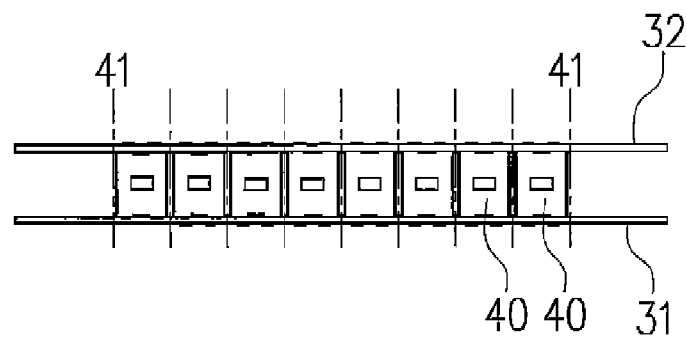
FIG. 17 is a view of the photo interrupter assembly as shown in FIG. 14, as viewed from a direction of arrow G.

FIG. 17 illustrates dicing cutting lines 41 of the completed photo interrupter assembly 90 as viewed from a direction of G in FIG. 14. The dicing cutting lines 41 are provided to be aligned with equal pitches of constant intervals of the combined frames 40, and the first collecting board 31 and the second collecting board 32 are adapted to be cut using a dicing cutter 42 having a similar thickness to each interval of the combined frames (see FIG. 18).

Next, the separating process of separating the photo interrupter assembly is described.

Figure 18:
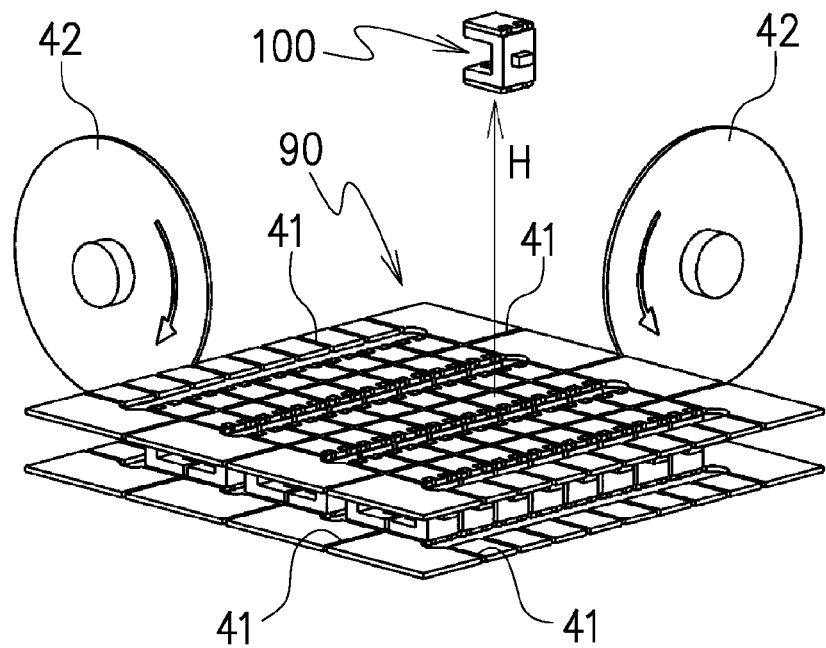
FIG. 18 is a perspective view showing a separation process of the photo interrupter assembly manufactured by the manufacturing method according to the second embodiment of the present invention.

As shown in FIG. 18, the completed photo interrupter assembly 90 is set on a dicing device (not shown) and cut by the dicing cutter 42 from respective directions along the dicing separation lines 41 as shown in FIGS. 15 and 17 and separated at one time into a plurality of single photo interrupters, one 100 of which is indicated by arrow H as shown in FIG. 18. In other words, three surfaces of the single photo interrupter are formed through cutting by dicing; a fourth surface forming the lower surface 8 of the connecting part (see FIG. 2) is previously formed by portions of the slits 22 and 23.

As is clear from the aforementioned manufacturing method, in the photo interrupter according to the present invention, the lower surface 8 and the positioning pin 9 of each of the combined frames are disposed between the slits formed as end surfaces of the electrodes of the first and second boards, and the other surfaces are cut along the dicing lines by dicing. Therefore, because the completed photo interrupter has the positioning pin 9, a position of mounting on the motherboard is reliably determined, and thereby the photo interrupter has no variation in detection of a mechanical operational position and can detect a position accurately. Also, the plurality of photo interrupters can be manufactured through the cutting by dicing and the separating at the same time, thus enabling provision of an inexpensive photo interrupter.

Figure 19:
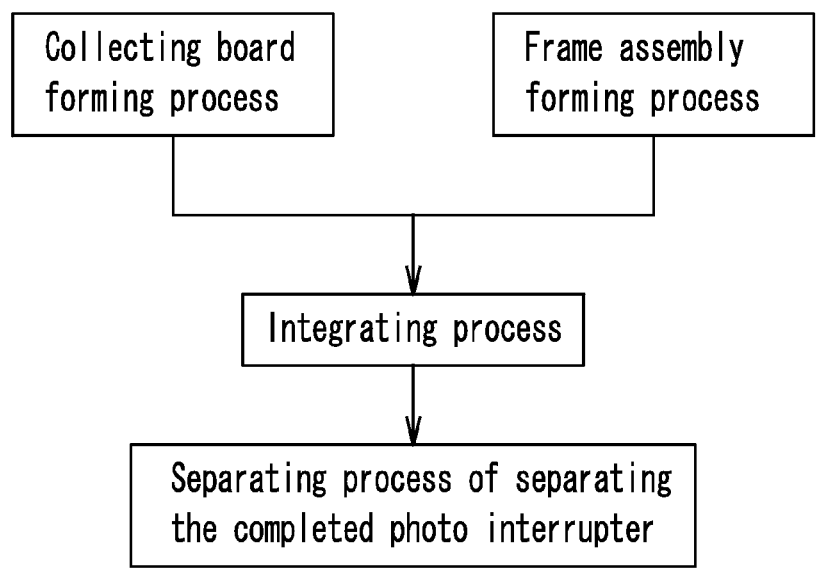
FIG. 19 is a view showing a manufacturing process of the manufacturing method according to the second embodiment of the present invention.

Note that, FIG. 19 illustrates processes of manufacturing the photo interrupter according to the second embodiment as mentioned above.

Third Embodiment

Next, a photo interrupter according to a third embodiment of the present invention is described.

A frame assembly in the third embodiment differs from that in the second embodiment in shape only and is similar thereto in material, other structure and processes of manufacturing. Accordingly, mainly the differences are described below and common points having the same structure and operation are omitted.

Figure 20:
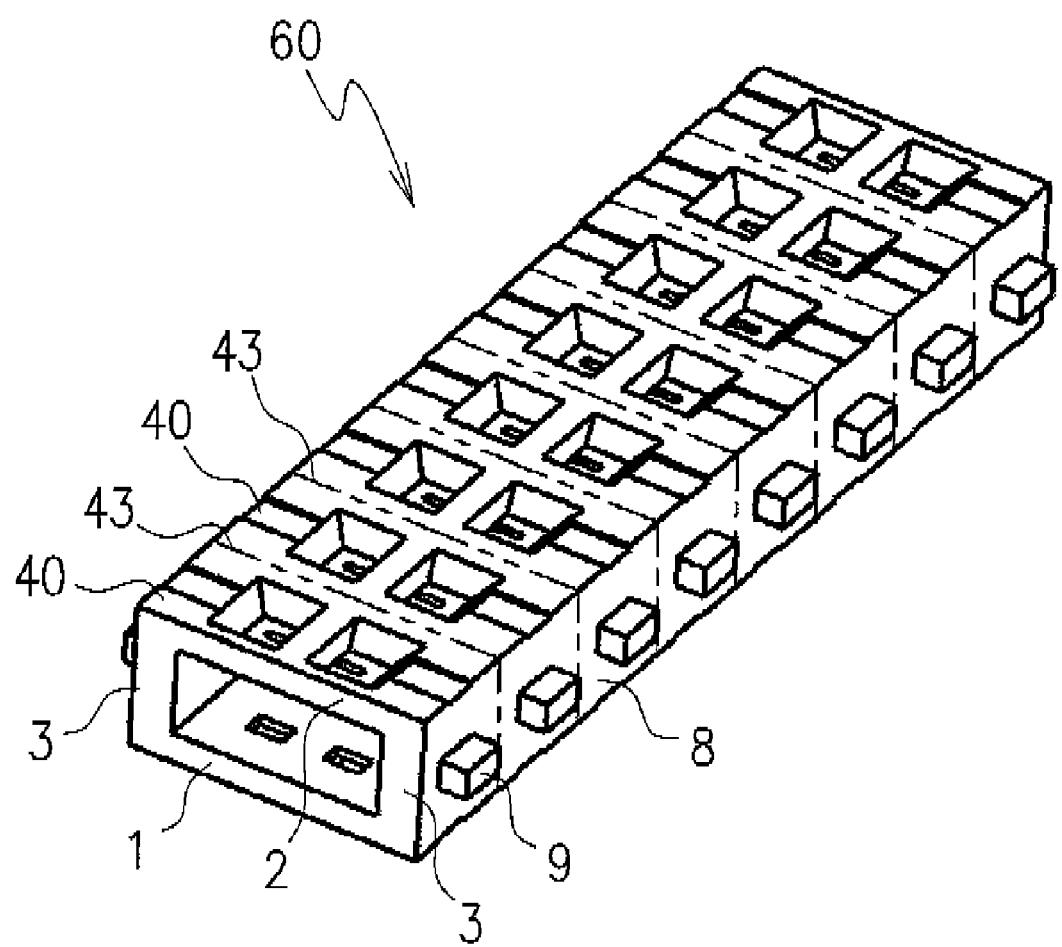
FIG. 20 is a perspective view showing an exterior appearance of a column frame as a frame assembly, in a manufacturing method for a photo interrupter according to a third embodiment of the present invention.

FIG. 20 is a perspective view showing an appearance of a column frame as the frame assembly in the third embodiment.

In FIG. 20, the column frame 60 as the frame assembly has a structure in which a plurality of combined frames 40 are integrally connected in a column state, as separated by dashed-two dotted lines 43.

More specifically, the combined frames 40 are connected by abutting side surfaces of a first frame part 1, a second frame part 2 and a connecting part 3 connecting the first and second frame parts 1 and 2 of each of the combined frames 40. The connection of the lower surfaces 8 of the connecting parts 3 of the combined frames 40 causes one wide lower surface to form, and the number of the positioning pins 9 is set to be at least the same as the number of the combined frames 40. Because the column frame 60 is structured by the plurality of combined frames 40, the plurality of combined frames can be set on a tray at one time when performing the integrating process of the first collecting board and the column frame 60. This makes it possible to shorten the number of manufacturing processes and achieve a reduction in cost.

Note that, a length of the column frame 60 is decided in consideration of ease of making an injection forming mold, and is not limited to the illustrated embodiment.

Fourth Embodiment

Next, a photo interrupter according to a fourth embodiment of the present invention is described.

A frame assembly in the fourth embodiment differs from that in the third embodiment in shape only and is similar thereto in material, other structure and processes of manufacturing. Accordingly, mainly the differences are described below and common points having the same structure and operation are omitted.

Figure 21:
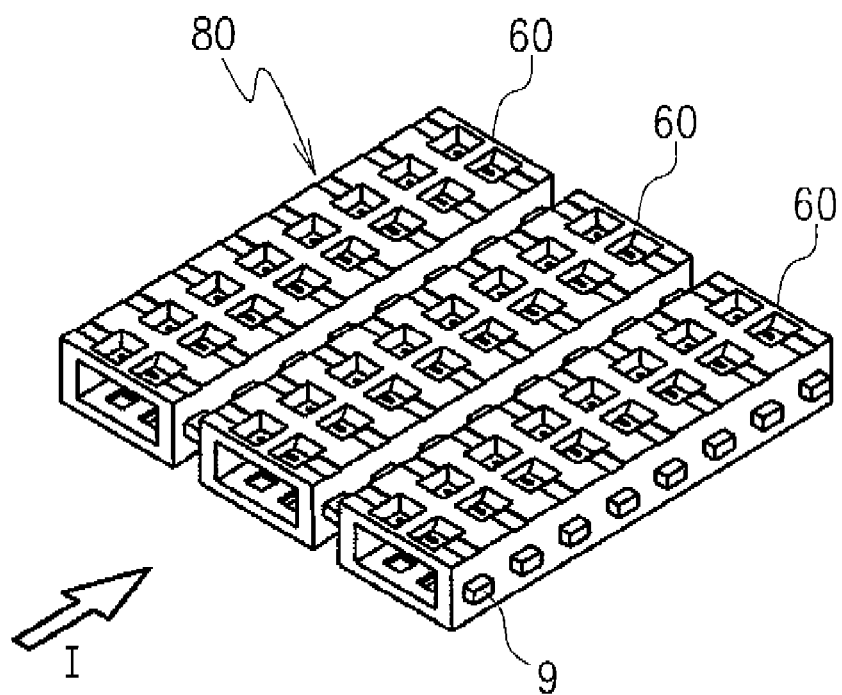
FIG. 21 is a perspective view showing an exterior appearance of a matrix frame as a frame assembly, in a manufacturing method for a photo interrupter according to a fourth embodiment of the present invention.
Figure 22:
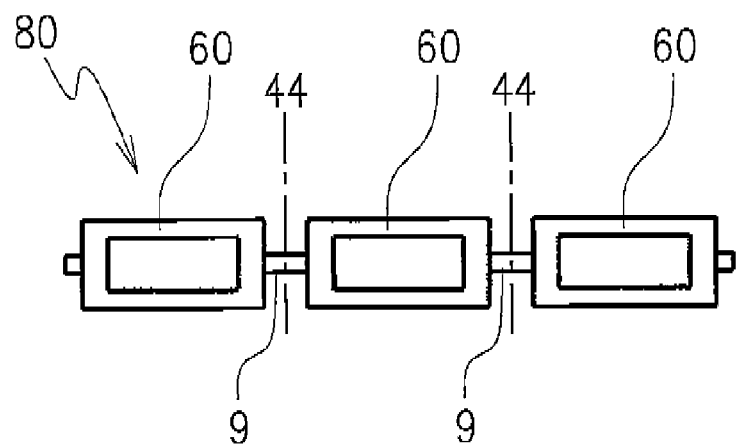
FIG. 22 is a view of the matrix frame as shown in FIG. 21, as viewed from a direction of arrow I.

FIG. 21 is a perspective view showing an appearance of a matrix frame 80 as the frame assembly in the fourth embodiment and FIG. 22 is a view showing the matrix frame 80 shown in FIG. 21, as viewed from a direction of arrow I.

As shown in FIG. 20, the matrix frame 80 is formed by arranging a plurality of column frames 60 row-wise, abutting and connecting the positioning pins of the combined frames. FIG. 22 illustrates a state in which the matrix frame 80 is formed by abutting and connecting the positioning pins 9 of adjacent column frames 60. Therefore, the fourth embodiment differs from the second embodiment in that separation of the connected positioning pins 9 along each of pin-separation lines 44 by dicing in the separation process of the photo interrupter assembly is added.

By use of the matrix frame 80 according to the present invention, it is possible to set the plurality of combined frames on a tray row- and column-wise at one time when performing the integrating process of the first collecting board and the frame assembly, thereby enabling a significant reduction in processes of setting the frame assembly. Consequently, it is possible to provide a surface-mount type photo interrupter having a high positional accuracy through provision of the positioning pin and excellent mass productivity in which a plurality of photo interrupters can be inexpensively manufactured through the photo interrupter separating process by simultaneous dicing.

Note that, an outer shape of the matrix frame 80 is decided in consideration of ease of making an injection forming mold, and is not limited to the illustrated embodiment.

Fifth Embodiment

Figure 23:
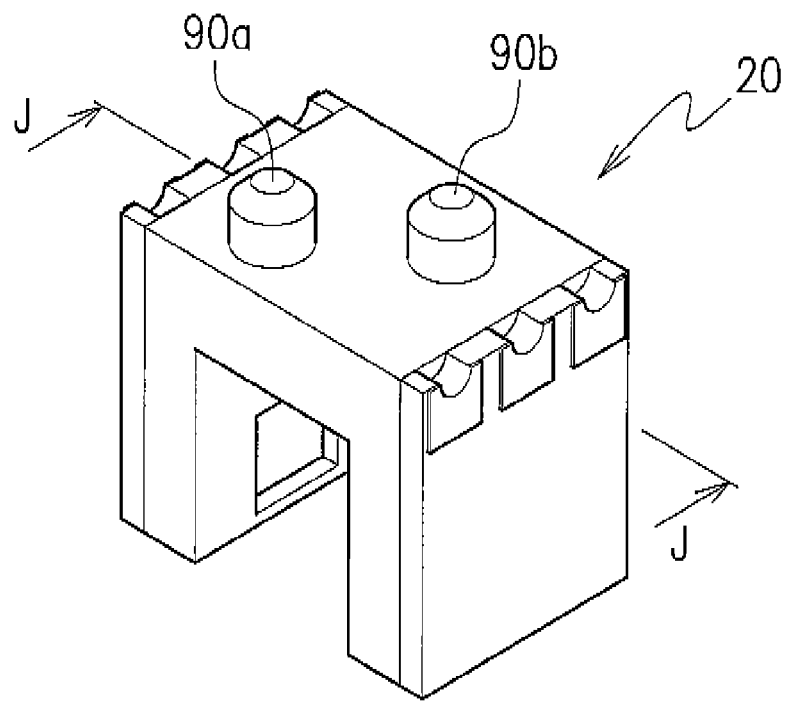
FIG. 23 is a perspective view showing a photo interrupter as manufactured by a manufacturing method according to a fifth embodiment of the present invention.
Figure 24:
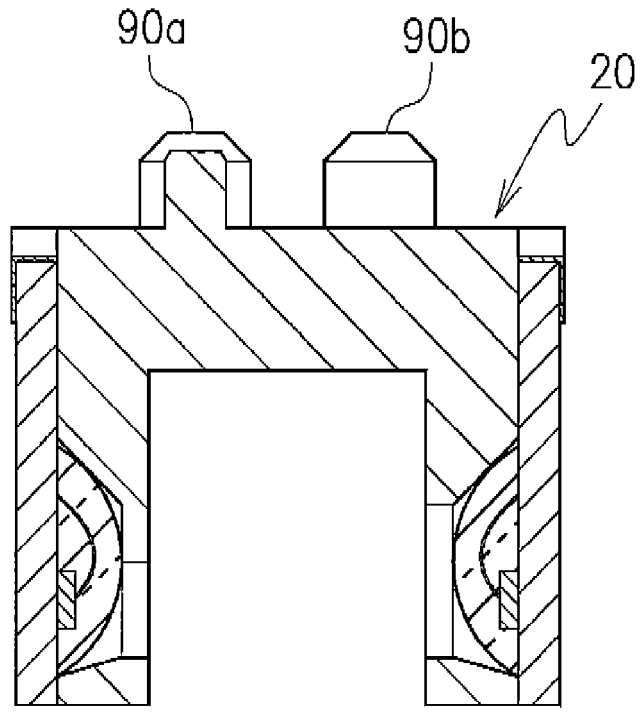
FIG. 24 is a sectional view taken along line J-J of the photo interrupter as shown in FIG. 23.

FIGS. 23 and 24 illustrate a photo interrupter according to a fifth embodiment of the present invention.

As shown in FIGS. 23 and 24, the photo interrupter in this fifth embodiment is configured to include a frame 20 having a first frame part, a second frame part disposed to face the first frame part, a connecting part connecting the first and second frame parts, and two positioning pins 90a and 90b provided on a lower surface of the connecting part to be formed integrally with the frame 20. Provision of the two positioning pins 90a and 90b in this way makes it possible to mount the photo interrupter on a motherboard in electronic instruments or the like more securely, when the positioning pins are inserted in engaged holes provided in the motherboard.

As mentioned above, in the manufacturing method according to the present invention, because the positioning member can be provided on the lower surface of the connecting part of the frame by way of the molding to be integrally formed with the frame, the positioning member can be provided on the frame firmly and accurately. Consequently, it is possible to position the photo interrupter on the motherboard accurately and fix the photo interrupter to the motherboard firmly, thereby enabling achievement of accurate position-detection without variation in a mounting position.

In addition, in the manufacturing method according to the present invention, because a plurality of photo interrupters can be manufactured at the same time by integrally adhering two collecting boards each of which is provided with a plurality of slits, a plurality of light-emitting elements, and a plurality of light-receiving elements, to a plurality of combined frames, and cutting an assembly thereof by dicing and dividing into a single photo interrupter individually, even if the two pins are provided, it is possible to achieve a manufacturing method having excellent mass productivity.

Although the preferred embodiments of the present invention have been described, it should be understood that the present invention is not limited to these embodiments, and that various modifications and changes can be made to the embodiments. For example, in the aforementioned embodiments, the photo interrupter including one light-emitting element and one light-receiving element disposed to face the light-emitting element has been described, but the photo interrupter may include a plurality of light-emitting elements and a plurality of light-receiving elements disposed to face the light-emitting elements, as a surface-mount type photo interrupter for phase detection.

What is claimed is:

1. A method of manufacturing a photo interrupter, comprising:
   forming a frame including a first frame part and a second frame part that are disposed at an interval to be facing each other, a connecting part integrally connecting the first frame part and the second frame part,
   the frame further comprising a positioning member including at least one positioning pin integrally provided with the connecting part, the at least one positioning pin being configured to be fitted in at least one engaging hole provided in an external motherboard;
   mounting at least one light-emitting element on a first board and attaching the first board to the first frame part of the frame;
   mounting a light-receiving element on a second board and attaching the second board to the second frame part of the frame, the light-receiving element being mounted on the second board to be facing the light-emitting element.

2. A method of manufacturing a photo interrupter, comprising:
   a first collecting board forming process including a step of mounting a plurality of light-emitting elements on a first surface of a first board material that includes a plurality of slits, a circuit pattern provided on the first surface of the first board material, and an electrode pattern provided on a second surface of the first board material and electrically connected to the circuit pattern;
   a second collecting board forming process including a step of mounting a plurality of light-receiving elements on a first surface of a second board material that includes a plurality of slits, a circuit pattern provided on the first surface of the second board material, and an electrode pattern provided on a second surface of the second board material and electrically connected to the circuit pattern;
   a combined frame forming process of forming a combined frame in which two frames are combined, each frame having a U-character-like shape and including a first frame part, a second frame part disposed to face the first frame part, a connecting part connecting the first and second frame part, and at least one positioning member provided on a lower surface of the connecting part;
   a frame assembly forming process include a plurality of combined frames are integrated in a state where the first frame part and the second frame part of each of the combined frames are abutted;
   a first integrating process of integrating the first collecting board and the frame assembly by positioning the first frame parts of the plurality of combined frames on the first collecting board at the plurality of light-emitting elements, respectively, aligning the connecting parts having the positioning pins of the combined frames with the slits of the first collecting board, and adhering fixedly the first surface of the first collecting board and the plurality of combined frames;
   a second integrating process of integrating the second collecting board and the frame assembly to form a photo interrupter assembly by positioning the plurality of light receiving elements of the second collecting board on the second frame parts of the plurality of combined frames adhered and fixed on the first collecting board, aligning the lower surfaces of the connecting parts having the positioning members of the combined frames with the slits of the second collecting board, and adhering fixedly the first surface of the second collecting board and the plurality of combined frames; and a separating process of separating the completed photo interrupter assembly by cutting the photo interrupter assembly by dicing and dividing it into a plurality of individual photo interrupters.

3. The method of manufacturing a photo interrupter according to claim 2,
   wherein the frame assembly in the frame assembly forming process is a column frame in which the plurality of combined frames are arranged in a column to abut side surfaces of the first frame parts of adjacent combined frames with each other, and side surfaces of the second frame parts of adjacent combined frames with each other.

4. The method of manufacturing a photo interrupter, according to claim 3, wherein the frame assembly in the frame assembly forming process is a matrix frame in which a plurality of column frames are arranged row-wise and connected to face the positioning pins with each other.

5. A photo interrupter manufactured by a method, comprising:
   a first collecting board forming process including a step of mounting a plurality of light-emitting elements on a first surface of a first board material that includes a plurality of slits, a circuit pattern provided on the first surface of the first board material, and an electrode pattern provided on a second surface of the first board material and electrically connected to the circuit pattern;
   a second collecting board forming process including a step of mounting a plurality of light-receiving elements on a first surface of a second board material including a plurality of slits, a circuit pattern provided on the first surface of the second board material, and an electrode pattern provided on a second surface of the second board material and electrically connected to the circuit pattern;
   a frame assembly forming process include a plurality of combined frames each having a U-character-like shape and including a first frame part, a second frame part disposed to face the first frame part, a connecting part connecting the first and second frame part, and a positioning member provided on a lower surface of the connecting part, the plurality of combined frames being integrated in a state where the first frame part and the second frame part of each of the combined frames are abutted;
   a first integrating process of integrating the first collecting board and the frame assembly by positioning the first frame parts of the plurality of combined frames on the first collecting board at the plurality of light-emitting elements, respectively, aligning the connecting parts having the positioning pins of the combined frames with the slits of the first collecting board, and adhering fixedly the first surface of the first collecting board and the plurality of combined frames;
   a second integrating process of integrating the second collecting board and the frame assembly to form a photo interrupter assembly by positioning the plurality of light-receiving elements of the second collecting board on the second frame parts of the plurality of combined frames adhered and fixed on the first collecting board, aligning the lower surfaces of the connecting parts having the positioning members of the combined frames with the slits of the second collecting board, and adhering fixedly the first surface of the second collecting board and the plurality of combined frames; and a separating process of separating the completed photo interrupter assembly by cutting the photo interrupter assembly by dicing and dividing it into a plurality of individual photo interrupter.

6. A photo interrupter comprising:

a frame including a first frame part and a second frame part that are disposed at an interval to face each other, a connecting part integrally connecting the first frame part and the second frame part, and a positioning member, the positioning member including at least one positioning pin integrally provided with a lower surface of the connecting part, the at least one positioning pin being configured to be fitted in at least one engaging hole provided in an external motherboard;

a first board provided at the first frame part;

at least one light-emitting element mounted on the first board;

a second board provided at the second frame part;

at least one light-receiving element mounted on the second board to face the at least one light-emitting element.

7. The photo interrupter according to claim 6, wherein the positioning member includes two positioning pins integrally provided with the lower surface of the connecting part, the two positioning pins being configured to be fitted in two engaging holes provided in the external motherboard.

8. The photo interrupter according to claim 6, wherein the at least one light-emitting element includes a light-emitting surface that is exposed from an opening of the first frame part, and wherein the at least one light-receiving element includes a light-receiving surface that is exposed from an opening of the second frame part.

9. The photo interrupter according to claim 8, wherein a gap is configured to be provided between an end surface of each of the first board and the second board and a surface of a motherboard when the lower surface of the connecting part is closely fitted to the surface of the external motherboard.

10. The photo interrupter according to claim 7, wherein the at least one light-emitting element includes a light-emitting surface that is exposed from an opening of the first frame part, and wherein the at least one light-receiving element includes a light-receiving surface that is exposed from an opening of the second frame part.

11. The photo interrupter according to claim 10, wherein a gap is configured to be provided between an end surface of each of the first board and the second board and a surface of a motherboard when the lower surface of the connecting part is closely fitted to the surface of the external motherboard.

* * * * *